United States Patent
Jeong et al.

(10) Patent No.: US 7,955,709 B2
(45) Date of Patent: Jun. 7, 2011

(54) ORGANIC LIGHT EMITTING DISPLAY DEVICE AND METHOD OF FABRICATING THE SAME

(75) Inventors: Hee-Seong Jeong, Suwon-si (KR);
Sam-Il Kho, Suwon-si (KR);
Byeong-Wook Yoo, Suwon-si (KR);
Seong-Taek Lee, Suwon-si (KR);
Jun-Sik Oh, Suwon-si (KR); Gun-Shik Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 520 days.

(21) Appl. No.: 11/937,446

(22) Filed: Nov. 8, 2007

(65) Prior Publication Data

US 2008/0241561 A1    Oct. 2, 2008

(30) Foreign Application Priority Data

Dec. 22, 2006    (KR) .................. 10-2006-0132925

(51) Int. Cl.
   *H01L 51/50* (2006.01)
(52) U.S. Cl. ........... 428/472; 428/457; 428/690; 427/66
(58) Field of Classification Search ................ 428/690, 428/472, 457; 427/66
   See application file for complete search history.

(56) References Cited

U.S. PATENT DOCUMENTS

| 6,330,100 | B2 * | 12/2001 | Van Aerle et al. | 359/254 |
| 6,563,262 | B1 * | 5/2003 | Cao | 313/506 |
| 7,180,235 | B2 * | 2/2007 | Gotoh et al. | 313/497 |
| 2005/0161665 | A1 * | 7/2005 | Winters et al. | 257/40 |
| 2005/0162075 | A1 * | 7/2005 | Madathil et al. | 313/504 |
| 2005/0249974 | A1 | 11/2005 | Mori et al. | |
| 2006/0049747 | A1 | 3/2006 | Matsuda et al. | |

FOREIGN PATENT DOCUMENTS

| EP | 1 662 574 A2 | 5/2006 |
| JP | 10-223377 | 8/1998 |
| JP | 2004-63466 | 2/2004 |
| KR | 10-2006-0049051 | 5/2006 |
| KR | 10-2006-0059721 | 6/2006 |
| KR | 10-2006-0060171 | 6/2006 |

(Continued)

OTHER PUBLICATIONS

European Search Report dated Mar. 31, 2008, for corresponding European patent application 07123983.4, indicating relevance of listed references in this IDS.

(Continued)

*Primary Examiner* — D. Lawrence Tarazano
*Assistant Examiner* — J. L. Yang
(74) *Attorney, Agent, or Firm* — Christie, Parker & Hale, LLP

(57) ABSTRACT

An organic light emitting display device and a method of fabricating the same, in which a resonance effect is suppressed and transmittance is substantially the same in a wavelength band of visible light. The organic light emitting display device includes: a substrate; a first electrode disposed on the substrate and including a reflection layer; an organic layer disposed on the first electrode and including a white emission layer; a second electrode disposed on the organic layer; a transmittance controlled layer disposed on the second electrode; and a metal layer disposed on the transmittance controlled layer.

19 Claims, 11 Drawing Sheets

FOREIGN PATENT DOCUMENTS

| KR | 10-2006-0064477 | 6/2006 |
|---|---|---|
| KR | 10-2006-0102446 | 9/2006 |
| KR | 10-0623696 | 9/2006 |

OTHER PUBLICATIONS

Neyts, K., et al., *Semitransparent metal or distributed Bragg reflector for wide-viewing-angle organic light-emitting-diode microcavities*, J. Opt. Soc. Am. B, vol. 17, No. 1, Jan. 2000, pp. 114-118, XP-002936799.

Shiga, T., et al., *Design of multiwavelength resonant cavities for white organic light-emitting diodes*, Journal of Applied Physics, vol. 93, No. 1, Jan. 1, 2003, pp. 19-22, XP 002473413.

Patent Abstracts of Japan, Publication No. 10-223377; Date of Publication: Aug. 21, 1998; in the name of Supratik Guha et al.

Patent Abstracts of Japan, Publication No. 2004-063466; Date of Publication: Feb. 26, 2004; in the name of Cuong Vong et al.

Korean Patent Abstracts, Publication No. 1020060102446 A; Date of Publication: Sep. 27, 2006; in the name of Tae Wook Kang.

Korean Patent Abstracts for Registered Korean Patent No. 10-0623696, Publication No. 1020060020050 A; Date of Publication: Mar. 6, 2006; in the name of Byung Doo Chin et al.

Korean Patent Abstracts, Publication No. 1020060049051 A; Date of Publication: May 18, 2006; in the name of Hany Aziz.

Korean Patent Abstracts, Publication No. 1020060059721 A; Date of Publication: Jun. 2, 2006; in the name of Kwan Hee Lee et al.

Korean Patent Abstracts, Publication No. 1020060060171 A; Date of Publication Jun. 5, 2006; in the name of Young Wook Ko et al.

Korean Patent Abstracts, Publication No. 1020060064477 A; Date of Publication Jun. 13, 2006; in the name of Kyung Hyun Kim et al.

Notice of Allowability dated Oct. 31, 2007, for corresponding Korean Patent Application No. 10-2006-0132925.

\* cited by examiner

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2006-0132925, filed on Dec. 22, 2006, in the Korean Intellectual Property Office, the entire content of which is incorporated herein by reference.

BACKGROUND OF THE INVENTION

1. Field of the Invention

The present invention relates to an organic light emitting display device capable of representing white light, and a method of fabricating the same.

2. Description of the Related Art

An organic light emitting display device includes a substrate, an anode disposed on the substrate, an emission layer (EML) disposed on the anode, and a cathode disposed on the emission layer. In the organic light emitting display device, when a voltage is applied between the anode and the cathode, holes and electrons are injected into the emission layer and recombined to create excitons. The excitons transition from an excited state to a ground state, thereby emitting light.

To display full colors, an organic light emitting display device can include emission layers corresponding to red (R), green (G), and blue (B), respectively. However, such red, green and blue emission layers of the organic light emitting display device have different luminance efficiencies (Cd/A). These different luminance efficiencies cause the red, green and blue emission layers to emit light at different brightness. Generally, the brightness of the emission layer is approximately proportional to a current. Therefore, when the same current is applied, one color light may be emitted to have a relatively low brightness but another color light may be emitted to have a relatively high brightness, so that it is difficult to have proper color balance or white balance. For example, the luminance efficiency of the green emission layer is from three to six times higher than those of the red and blue emission layers, so that more current should be applied to the red and blue emission layers to adjust the white balance.

To enhance white balance, an organic light emitting display device has been proposed which includes an emission layer formed to emit monochromic light (i.e., white light), and a color filter layer to filter light corresponding to a predetermined color of light from the emission layer (or a color conversion layer to convert the light emitted from the emission layer into a predetermined color of light).

FIG. 1 is a cross-sectional view of a conventional top-emission organic light emitting display device.

Referring to FIG. 1, a substrate 100 is provided, and a first electrode 110 having a reflection layer is formed on the substrate 100. Further, a thin film transistor and a capacitor may be provided between the first electrode 110 and the substrate 100.

An organic layer 120 including an emission layer is formed on the first electrode 110. The emission layer may be a single layer structure or a multiple layer structure. Further, a second electrode 130, which is transflective, is formed on the organic layer 120.

In this conventional top-emission organic light emitting display device, a resonance effect occurs due to the transflective second electrode 130. In addition, in the case where the white emission layer and the color filter are used to realize full colors, red, green and blue emission layers are stacked adjacent to one another and employed as the white emission layer. However, white light is not properly realized because of the resonance effect due to the transflective second electrode 130. Further, the resonance effect causes light to be emitted with different wavelengths according to viewing angles. Such a resonance effect largely depends on the thickness of the organic layer, so that a wavelength band of the filtered light varies according to thickness distribution of the organic layer, thereby making color and brightness representation unstable.

SUMMARY OF THE INVENTION

An aspect of an embodiment of the present invention is directed to an organic light emitting display device, in which red, green and blue peaks are equivalent in transmittance in a wavelength band of visible light and which is capable of representing white light, and a method of fabricating the same.

An aspect of an embodiment of the present invention is directed to an organic light emitting display device, which has substantially the same transmittance in a wavelength band of visible light and is thus capable of representing white light, and a method of fabricating the same.

An aspect of an embodiment of the present invention is directed to an organic light emitting display device, which includes a transmittance controlled layer (TCL) and a metal layer, and a method of fabricating the same According to an embodiment of the present invention, an organic light emitting display device includes: a substrate; a first electrode disposed on the substrate and including a reflection layer; an organic layer disposed on the first electrode and including a white emission layer; a second electrode disposed on the organic layer; a transmittance controlled layer disposed on the second electrode; and a metal layer disposed on the transmittance controlled layer.

According to another embodiment of the present invention, a method of fabricating an organic light emitting display device includes: providing a substrate; forming a first electrode including a reflection layer on the substrate; forming an organic layer including a white emission layer on the first electrode; forming a second electrode on the organic layer; forming a transmittance controlled layer on the second electrode; and forming a metal layer on the transmittance controlled layer.

According to another embodiment of the present invention, an organic light emitting display device includes: a substrate; a reflective electrode disposed on the substrate; an organic layer disposed on the reflective electrode; a transflective electrode disposed on the organic layer; a transmittance controlled layer disposed on the transflective electrode; and a metal layer disposed on the transmittance controlled layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
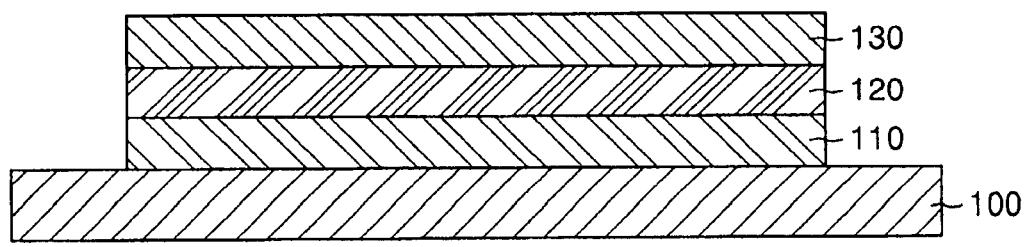
FIG. 1 is a cross-sectional view of a conventional top-emission organic light emitting display device.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Also, in the context of the present application, when an element (e.g., a layer or a substrate) is referred to as being "on" another element, it can be directly on the another element or be indirectly on the another element with one or more intervening elements interposed therebetween. Hereinafter, like reference numerals refer to like elements.

Figure 2:
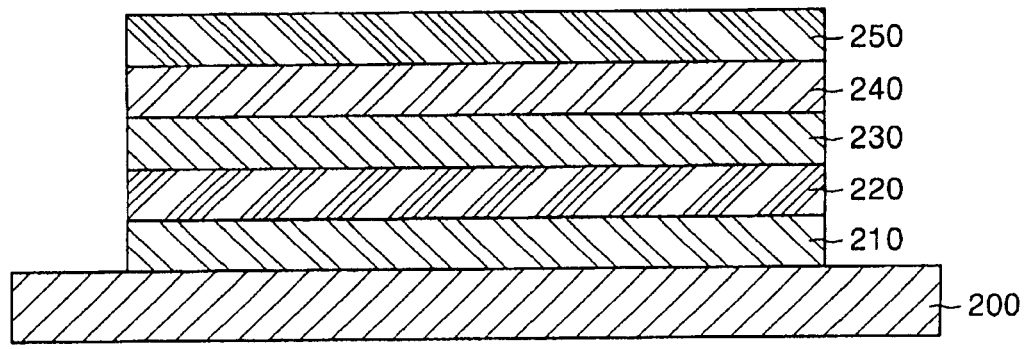
FIG. 2 is a cross-sectional view of an organic light emitting display device according to an exemplary embodiment of the present invention.

FIG. 2 is a cross-sectional view of an organic light emitting display device according to an exemplary embodiment of the present invention.

Referring to FIG. 2, a substrate 200 is provided, and a first electrode 210 having a reflection layer is formed on the substrate 200. Here, the first electrode 210 may be a double electrode structure or a triple electrode structure. When the first electrode 210 is formed to be a double electrode structure, it may be formed by sequentially stacking a reflection layer made of aluminum, silver or alloys thereof, and a transparent conductive layer made of indium tin oxide (ITO), indium zinc oxide (IZO) and/or indium tin zinc oxide (ITZO). When the first electrode 210 is formed to be a triple electrode structure, it may be formed by sequentially stacking a first metal layer made of titanium, molybdenum, ITO or alloys thereof, a second metal layer made of aluminum, silver or alloys thereof, and a third metal layer made of ITO, IZO and/or ITZO.

Further, a thin film transistor, a capacitor, and the like may be provided between the substrate 200 and the first electrode 210.

An organic layer 220 including a white emission layer is formed on the first electrode 210. Here, the white emission layer may be a single layer structure or a multiple layer structure.

When the white emission layer is formed to be a single layer structure, respective emission materials for different colors are mixed together with a dopant or carbazole-based molecules (PVK) are mixed with PBD, TPB, coumarin 6, DCM1 and Nile red in a proper ratio so as to represent white light. In one embodiment, two emission materials for two different colors are mixed and then another emission material for another color is mixed thereto, thereby obtaining a white emission material. For example, a red emission material and a green emission material are mixed and a blue emission material is mixed thereto, thereby obtaining the white emission material. The red emission material includes a material selected from the group consisting of a polymer material such as a polythiophene (PT) and its derivatives. The green emission material includes a material selected from the group consisting of a low molecular material such as Alq3, BeBq2 and Almq, and a polymer material such as poly(p-phenylenevinylene) (PPV) and their derivatives. The blue emission material includes a material selected from the group consisting of a low molecular material such as ZnPBO, Balq, DPVBi and OXA-D, a polymer material such as polyphenylene, and their derivatives.

When the white emission layer is formed to be a multiple layer structure, it may include two layers which emit light of different wavelength ranges. One layer is an emission layer for emitting light of an orange-red wavelength range, and the other layer is an emission layer for emitting light of a blue wavelength range. Here, a phosphorescent emission layer may be used to emit light of the orange-red wavelength range, and a fluorescent emission layer may be used to emit light of the blue wavelength range. The phosphorescent emission layer has a relatively high luminous efficiency as compared with the fluorescent emission layer for emitting light of the same wavelength range, while the fluorescent emission layer has a relatively high durability. Thus, the white emission layer, in which the phosphorescent emission layer that emits light of the orange-red wavelength range and the fluorescent emission layer that emits light of the blue wavelength range are stacked, can have both a relatively high luminous efficiency and a relatively high durability. In one embodiment, the white emission layer is formed to be a two layer structure that may include a polymer material, a low molecular material, or a double layer thereof.

In one embodiment, the white emission layer is formed to be a three layer structure. For example, the white emission layer is formed to have red, green, and blue emission layers, and the red, green, and blue emission layers may be stacked with any suitable stacking order.

The red emission layer may include a low molecular material such as Alq3 (host)/DCJTB (fluorescent dopant), Alq3 (host)/DCM (fluorescent dopant), CBP (host)/PtOEP (phosphorescent organic metal complex), or the like, or a polymer material such as a PFO-based polymer, a PPV-based polymer, or the like.

The green emission layer may include a low molecular material such as Alq3, Alq3 (host)/C545t (dopant), CBP (host)/IrPPY (phosphorescent organic complex), or the like, or a polymer material such as a PFO-based polymer, a PPV-based polymer, or the like.

The blue emission layer may include a low molecular material such as DPVBi, spiro-DPVBi, spiro-6P, distylbenzene (DSB), distyrylarylrene (DSA), or the like, or a polymer material such as a PFO-based polymer, a PPV-based polymer, or the like.

In addition, the organic layer 220 may be a single layer structure or a multiple layer structure, which includes one or more layers selected from a hole injection layer, a hole transport layer, an electron injection layer, an electron transport layer, and a hole blocking layer.

The hole injection layer facilitates injection of holes into an organic emission layer of an organic light emitting display device and increases the lifespan of the organic light emitting display device. The hole injection layer may include an arylamine-based compound, starbuster amine series, etc. In more detail, the hole injection layer may include 4,4,4-tris(3-methylphenylamino)triphenylamino(m-MTDATA), 1,3,5-tris[4-(3-methylphenylamino)phenyl]benzene(m-MTDATB), phthalocyanine copper (CuPc), etc.

The hole transport layer may include arylene diamine derivatives, a starbuster compound, spiro-biphenyldiamine derivatives, a ladder compound, etc. In more detail, the hole transport layer may include N,N-diphenyl-N,N-bis(4-methylphenyl)-1,1-biphenyl-4,4-diamine (TPD) or 4,4-bis[N-(1-naphryl)-N-phenylamino]biphenyl (NPB).

The hole blocking layer prevents (or blocks) holes from moving to the electron injection layer when electron mobility is larger than hole mobility in the organic emission layer. Here, the hole blocking layer may include a material selected from the group consisting of 2-biphenyl-4-il-5-(4-t-buthylphenyl)-1,3,4-oxythiazol (PBD), spiro-PBD, 3-(4-t-buthylphenyl)-4-phenyl-5-(4-biphenyl)-1,2,4-triazol (TAZ), and combinations thereof.

The electron transport layer may include a metal compound to facilitate transport of electrons. For example, the electron transport layer includes 8-hydroquinoline aluminum (Alq3) to more stably transport electrons from a cathode.

The electron injection layer may include a material selected from the group consisting of 1,3,4-oxythiazol derivatives, 1,2,4-triazol derivatives, LiF, and combinations thereof.

Further, the organic layer 220 may be formed by vacuum deposition, inkjet printing, and/or laser induced thermal imaging.

A transflective second electrode 230 is formed on the organic layer 220. The second electrode 230 may be formed of magnesium silver (MgAg) and/or aluminum silver (AlAg). Here, MgAg is formed by co-deposition of magnesium and silver, and the aluminum silver (AlAg) is formed in a stacked structure in which aluminum and silver are deposited in sequence. Further, a transparent conductive layer such as ITO or IZO may be formed on the second electrode 230.

A transmittance controlled layer (TCL) 240 is formed on the second electrode 230. The transmittance controlled layer 240 uses an interference effect to control transmittance and reflectance of the second electrode 230, thereby adjusting the intensity of a transmission spectrum according to wavelength bands. In more detail, the organic light emitting display device for realizing white light should have substantially (or approximately) the same transmittance in a wavelength band of visible light, particularly, should have substantially the same transmittance in the wavelength band ranging from about 450 to about 650 nm. However, red, green and blue spectrums themselves are likely to differ in intensity from one another, so that the transmittance controlled layer 240 is needed for controlling the transmittance.

Here, the transmission spectrum is referred to as an emission rate according to wavelengths of light when the light is emitted from the organic layer 220 of the organic light emitting display device to the outside. Further, the interference effect is referred to as a phenomenon of when light reflected from an interface between the transmittance controlled layer 240 and a metal layer (formed in a process described in more detail below) is reflected again from the surface of the underlying second electrode 230 to the outside. Here, an important physical property for the interference effect is a refractive index. The refractive index may vary depending on the wavelength of light and the thickness of the transmittance controlled layer.

In addition, when the organic light emitting display device for realizing the white light has a flat transmission spectrum in a wavelength band from 450 to 650 nm, it can be referred to as an optimal design. The transmittance at the optimal design is set as a reference transmittance, and when transmittance is higher than half of the reference transmittance in the wavelength band of visible light, i.e., from 450 to 650 nm, the organic light emitting display device can realize the white light. To satisfy this condition and in consideration of the metal layer 250 (formed in a process described in more detail below), the transmittance controlled layer 240 according to one embodiment of the present invention has an optical path length (OPL) ranging from 520 to 2140 Å. The white light can be checked by an electroluminescence (EL) spectrum obtained by a product of the light source spectrum and the transmission spectrum.

Here, the optical path length (OPL) is obtained by the product of the refractive index and the thickness of the transmittance controlled layer 240, and is proportional to the wavelength corresponding to the transmission spectrum. As mentioned above, the refractive index may vary according to the wavelength, and the thickness of the transmittance controller layer 240 may vary depending on the refractive index of a substance. Therefore, in one embodiment of the present invention, the refractive index and the thickness are not specifically limited as long as the product of the refractive index and the thickness satisfies the foregoing optical path length (OPL) of the transmittance controlled layer 240.

In one embodiment, a material for the transmittance controlled layer 240 is not limited specifically, but its absorption and reflection characteristics should not be too large. Thus, pure metal or substances having low transmittance should be excluded from the materials for the transmittance controlled layer 240. For example, the transmittance controlled layer 240 may include a material selected from the group consisting of $SiN_x$, $SiO_2$, SiON, $MgF_2$, ZnS, ZnSe, $TeO_2$, $ZrO_2$, aylenediamine derivatives, triamine derivatives, CBP, an aluminum-quinoline complex (Alq3), and combinations thereof. Further, the transmittance controlled layer 240 may be formed by vacuum deposition and/or lithography.

Then, the metal layer 250 is formed on the transmittance controlled layer 240. The metal layer 250 assists performance of the transmittance controlled layer 240, and serves as a blocking layer to separate the transmittance controlled layer 240 from an upper layer such as a protective layer and/or a color filter layer. Further, the metal layer 250 together with the transmittance controlled layer 240 maintains the interference effect of the transmittance controlled layer 240 and prevents (or reduces) the performance of the transmittance controlled layer 240 from being lowered due to the upper layer. Also, the metal layer 250 minimizes an effect (or an adverse effect) due to the upper layer.

The metal layer 250 causes the interference effect of the light, so that the metal layer 250 according to one embodiment is formed of a material in consideration of how light is reflected from a metal layer.

In addition, when the organic light emitting display device realizing the white light has a flat transmission spectrum in a wavelength band ranging from 450 to 650 nm, it can be called an optimal design. The transmittance at the optimal design is set as a reference transmittance, and when transmittance is higher than half of reference transmittance in the wavelength band of visible light, i.e., from 450 to 650 nm, the organic light emitting display device can realize the white light. To satisfy this condition by interaction between the transmittance controlled layer 240 and the metal layer 250, the metal layer 250 has a reflectance ranging from 4.3 to 48.3%. The white light can be checked by an electroluminescence (EL) spectrum obtained by a product of the light source spectrum and the transmission spectrum.

The reflectance and the transmittance of the metal layer 250 vary according to physical properties of a material even though it has the same thickness, so that the metal layer 250 is not limited to a specific thickness as long as it satisfies the reflectance ranging from 4.3 to 48.3%. In one exemplary embodiment, the metal layer 250 includes a transflective metal. Here, the transflective metal is selected from magnesium (Mg), silver (Ag), calcium (Ca), magnesium silver (MgAg), magnesium calcium (MgCa), aluminum silver (AlAg), ytterbium silver (YbAg), and combinations thereof. Also, the metal layer 250 may be formed by vacuum deposition and/or sputtering.

Additionally, a passivation layer and a color filter layer may be formed on the metal layer 250. The passivation layer may include an inorganic layer, an organic layer or an organic-inorganic hybrid layer. For example, the inorganic layer includes a material selected from the group consisting of ITO, IZO, $SiO_2$, $SiN_x$, $Y_2O_3$, $Al_2O_3$, and combinations thereof. The organic layer includes parylene and/or high density polyethylene (HDPE). The organic-inorganic hybrid layer includes a hybrid layer of $Al_2O_3$ and an organic polymer.

Further, the color filter layer may include a pigment, a polymer binder, and a functional monomer in addition to an acrylic resin used as a support. The color filter layer may be divided into a red color filter layer, a green color filter layer, and a blue color filter layer according to the pigment for representing colors. The red, green, and blue color filter layers make the light emitted from the organic layer 220 and transmitted therethrough have wavelengths corresponding to red, green, and blue ranges, respectively. Here, the pigments correspond to red, green, and blue colors, respectively. The polymer binder protects a liquid monomer from a developer (or from developing into polymer) in room temperature, and controls reliability such as stability of pigment dispersion; thermal, light, and chemical resistance of an RGB pattern; etc. The pigment includes organic particles, which have relatively high light resistance and thermal resistance and disperse light. The smaller the size of the particle (or the average size of the particles) is, the better the transparency and the dispersion properties of the color filter layer are. The color filter layer may be formed by vacuum deposition and/or laser induced thermal imaging.

As such and in view of the foregoing, an organic light emitting display device according to an exemplary embodiment of the present invention can be formed.

The following exemplary embodiments (and/or examples) illustrate the present invention in more detail. However, the present invention is not limited by these embodiments (and/or examples).

FIRST EXEMPLARY EMBODIMENT

Silver (Ag) was formed to a thickness of 1000 Å on a substrate, and indium tin oxide (ITO) was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer. Alq3 was formed to a thickness of 100 Å on the hole blocking layer as an electron transport layer. LiF was formed to a thickness of 5 Å on the electron transport layer as an electron injection layer. A second electrode formed of Al having a thickness of 20 Å and Ag having a thickness of 70 Å was formed on the electron injection layer, and $Al_2O_3$ was formed to a thickness of 900 Å on the Ag as a transmittance controlled layer. Ag was formed to a thickness of 90 Å on the transmittance controlled layer as a metal layer.

SECOND EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer, and Alq3 was formed to a thickness of 100 Å on the hole blocking layer as an electron transport layer. LiF was formed to a thickness of 5 Å on the electron transport layer as an electron injection layer. A second electrode formed of Al having a thickness of 20 Å and Ag having a thickness of 70 Å was formed on the electron injection layer. $Al_2O_3$ was formed to a thickness of 1000 Å on the Ag as a transmittance controlled layer, and Ag was formed to a thickness of 90 Å on the transmittance controlled layer as a metal layer.

THIRD EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer. Alq3 was formed to a thickness of 100 Å on the hole blocking layer as an electron transport layer, and LiF was formed to a thickness of 5 Å on the electron transport layer as an electron injection layer. A second electrode formed of Al having a thickness of 20 Å and Ag having a thickness of 70 Å was formed on the electron injection layer. $Al_2O_3$ was formed to a thickness of 1100 Å on the Ag as a transmittance controlled layer, and Ag was formed to a thickness of 90 Å on the transmittance controlled layer as a metal layer.

FOURTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer. Alq3 was formed to a thickness of 100 Å on the hole blocking layer as an electron transport layer, and LiF was formed to a thickness of 5 Å on the electron transport layer as an electron injection layer. A second electrode formed of Al having a thickness of 20 Å and Ag having a thickness of 70 Å was formed on the electron injection layer, and $Al_2O_3$ was formed to a thickness of 1000 Å on the Ag as a transmittance controlled layer. Ag was formed to a thickness of 13 Å on the transmittance controlled layer as a metal layer.

FIFTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer. Alq3 was formed to a thickness of 100 Å on the hole blocking layer as an electron transport layer, and LiF was formed to a thickness of 5 Å on the electron transport layer as an electron injection layer. A second electrode formed of Al having a thickness of 20 Å and Ag having a thickness of 70 Å was formed on the electron injection layer. $Al_2O_3$ was formed to a thickness of 1000 Å on the Ag as a transmittance controlled layer, and silver was formed to a thickness of 90 Å on the transmittance controlled layer as a metal layer.

SIXTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer, and Alq3 was formed to a thickness of 100 Å on the hole blocking layer as an electron transport layer. LiF was formed to a thickness of 5 Å on the electron transport layer as an electron injection layer. A second electrode formed of Al having a thickness of 20 Å and Ag having a thickness of 70 Å was formed on the electron injection layer. $Al_2O_3$ was formed to a thickness of 1000 Å on the Ag as a transmittance controlled layer, and Ag was formed to a thickness of 210 Å on the transmittance controlled layer as a metal layer.

SEVENTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer, and Alq3 was formed to a thickness of 100 Å on the hole blocking layer as an electron transport layer. LiF was formed to a thickness of 5 Å on the electron transport layer as an electron injection layer. A second electrode formed of Al having a thickness of 20 Å and Ag having a thickness of 70 Å was formed on the electron injection layer. $MgF_2$ was formed to a thickness of 1050 Å on the Ag as a transmittance controlled layer, and Ag was formed to a thickness of 90 Å on the transmittance controlled layer as a metal layer.

EIGHTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer. Alq3 was formed to a thickness of 100 Å on the hole blocking layer as an electron transport layer, and LiF was formed to a thickness of 5 Å on the electron transport layer as an electron injection layer. A second electrode formed of Al having a thickness of 20 Å and Ag having a thickness of 70 Å was formed on the electron injection layer. $MgF_2$ was formed to a thickness of 1034 Å on the Ag as a transmittance controlled layer, and Ag was formed to a thickness of 90 Å on the transmittance controlled layer as a metal layer.

NINTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer, and Alq3 was formed to a thickness of 100 Å on the hole blocking layer as an electron transport layer. LiF was formed to a thickness of 5 Å on the electron transport layer as an electron injection layer. A second electrode formed of Al having a thickness of 20 Å and Ag having a thickness of 70 Å was formed on the electron injection layer. $MgF_2$ was formed to a thickness of 1550 Å on the Ag as a transmittance controlled layer, and Ag was formed to a thickness of 90 Å on the transmittance controlled layer as a metal layer.

TENTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer. Alq3 was formed to a thickness of 100 Å on the hole blocking layer as an electron transport layer, and LiF was formed to a thickness of 5 Å on the electron transport layer as an electron injection layer. A second electrode formed of Al having a thickness of 20 Å and Ag having a thickness of 70 Å was formed on the electron injection layer. ZnSe was formed to a thickness of 200 Å on the Ag as a transmittance controlled layer, and Ag was formed to a thickness of 90 Å on the transmittance controlled layer as a metal layer.

ELEVENTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer, and Alq3 was formed to a thickness of 100 Å on the hole blocking layer as an electron transport layer. LiF was formed to a thickness of 5 Å on the electron transport layer as an electron injection layer. A second electrode formed of Al having a thickness of 20 Å and Ag having a thickness of 70 Å was formed on the electron injection layer. ZnSe was formed to a thickness of 400 Å on the Ag as a transmittance controlled layer, and silver was formed to a thickness of 90 Å on the transmittance controlled layer as a metal layer.

TWELFTH EXEMPLARY EMBODIMENT

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer, and Alq3 was formed to a thickness of 100 Å on the hole blocking layer as an electron transport layer. LiF was formed to a thickness of 5 Å on the electron transport layer as an electron injection layer. A second electrode formed of Al having a thickness of 20 Å and Ag having a thickness of 70 Å was formed on the electron injection layer. ZnSe was formed to a thickness of 620 Å on the Ag as a transmittance controlled layer, and Ag was formed to a thickness of 90 Å on the transmittance controlled layer as a metal layer.

COMPARATIVE EXAMPLE

Ag was formed to a thickness of 1000 Å on a substrate, and ITO was formed to a thickness of 70 Å on the Ag. IDE406 available from Idemitsu was formed to a thickness of 250 Å on the ITO as a hole injection layer, and IDE320 available from Idemitsu was formed to a thickness of 150 Å on the hole injection layer as a hole transport layer. A blue emission layer that contains BH215 available from Idemitsu as a host and BD052 available from Idemitsu as a dopant by 1 wt % was formed to a thickness of 80 Å on the hole transport layer. A green emission layer that contains CBP available from UDC as a host and GD33 available from UDC as a dopant by 7 wt % was formed to a thickness of 100 Å on the blue emission layer. A red emission layer that contains CBP available from UDC as a host and TER004 available from COVION as a dopant by 12 wt % was formed to a thickness of 120 Å on the green emission layer. Balq available from UDC was formed to a thickness of 50 Å on the red emission layer as a hole blocking layer. Alq3 was formed to a thickness of 100 Å on the hole blocking layer as an electron transport layer. LiF was formed to a thickness of 5 Å on the electron transport layer as an electron injection layer. A second electrode formed of Al having a thickness of 20 Å and Ag having a thickness of 70 Å was formed on the electron injection layer. $Al_2O_3$ was formed to a thickness of 1000 Å on the Ag as a transmittance controlled layer.

Figure 3:
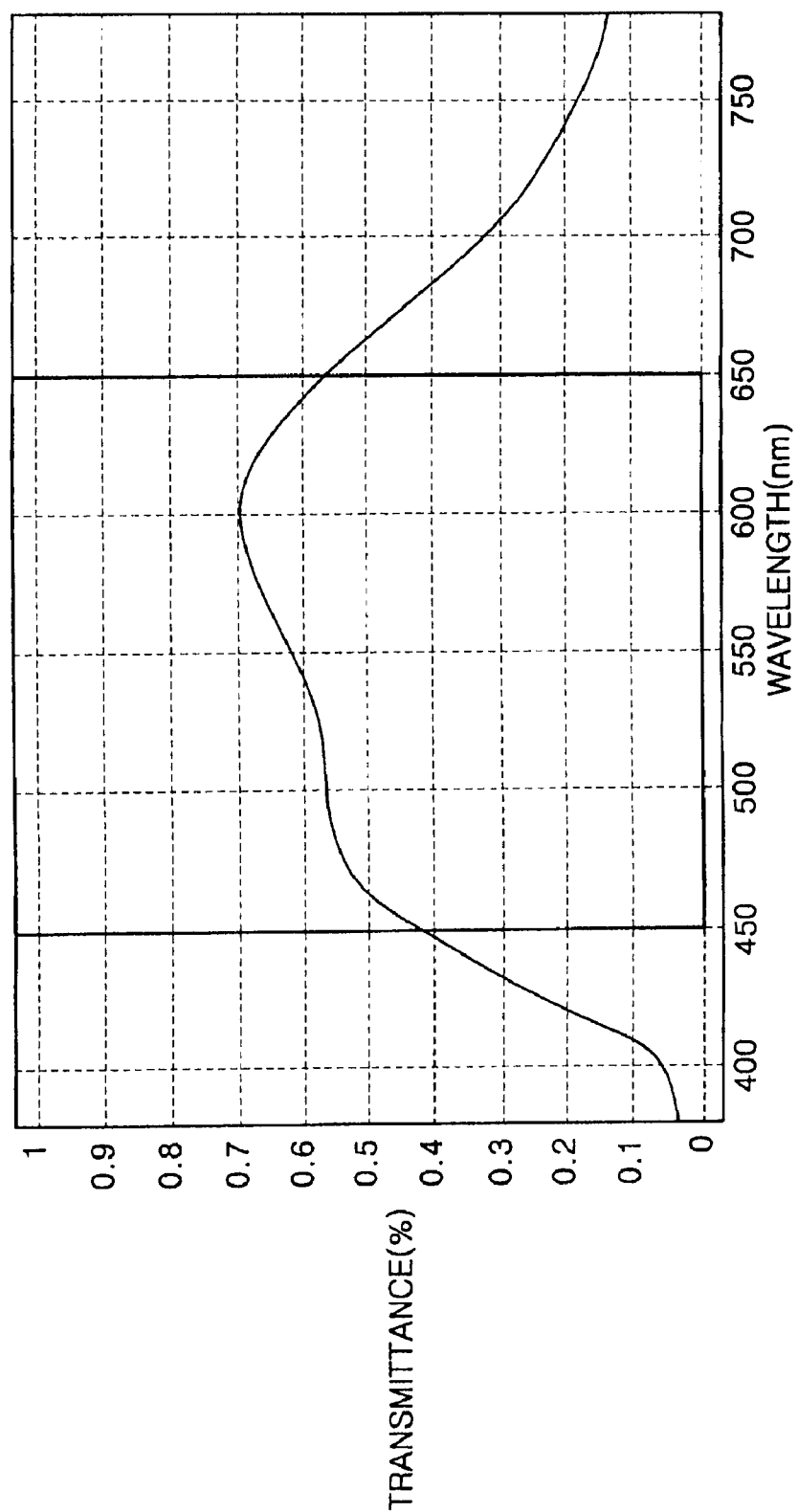
FIG. 3 is a graph showing a transmission spectrum according to a first exemplary embodiment of the present invention.

FIG. 3 is a graph showing a transmission spectrum according to the first exemplary embodiment of the present invention, in which a horizontal axis denotes a wavelength (nm) and a vertical axis denotes a transmittance (%).

Referring to FIG. 3, in the first exemplary embodiment, transmittance is 0.4% at a wavelength of 450 nm and increases to 0.6% at a wavelength of 550 nm. At a wavelength of 600 nm, the transmittance has a maximum value of 0.7%. In a wavelength band from 600 to 650 nm, the transmittance slowly decreases from 0.7% to 0.6%. Thus, the transmittance according to the first exemplary embodiment is from 0.4 to 0.7% in a wavelength band of visible light. Here, the transmittance controlled layer according to the first exemplary embodiment has a refractive index of 1.75, and an optical path length of 1575 Å. Further, the metal layer has a reflectance of 24.3%.

Figure 4:
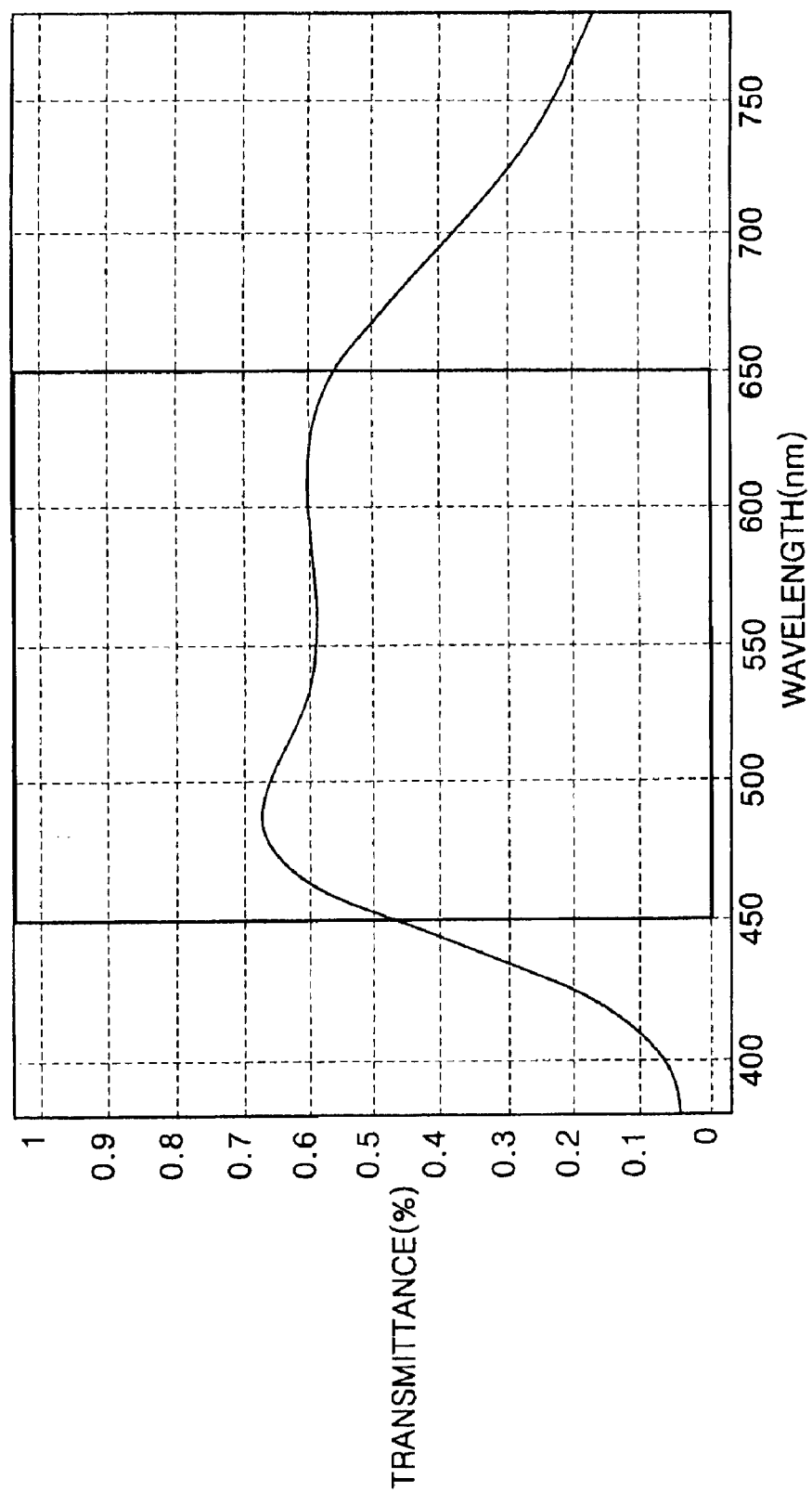
FIG. 4 is a graph showing a transmission spectrum according to a second exemplary embodiment of the present invention.

FIG. 4 is a graph showing a transmission spectrum according to the second exemplary embodiment of the present invention, in which a horizontal axis denotes a wavelength (nm) and a vertical axis denotes a transmittance (%).

Referring to FIG. 4, in the second exemplary embodiment, transmittance has a maximum value of 0.65% at a wavelength of about 470 nm, and decreases to about 0.6% in a wavelength band of from 500 to 650 nm with a starting point of 470 nm. Thus, the transmittance according to the second exemplary embodiment is stable in the wavelength band (from 450 nm to 650 nm) of visible light. Here, the transmittance controlled layer according to the second exemplary embodiment has a refractive index of 1.75, and an optical path length of 1750 Å. Further, the metal layer has a reflectance of 24.3%.

Figure 5:
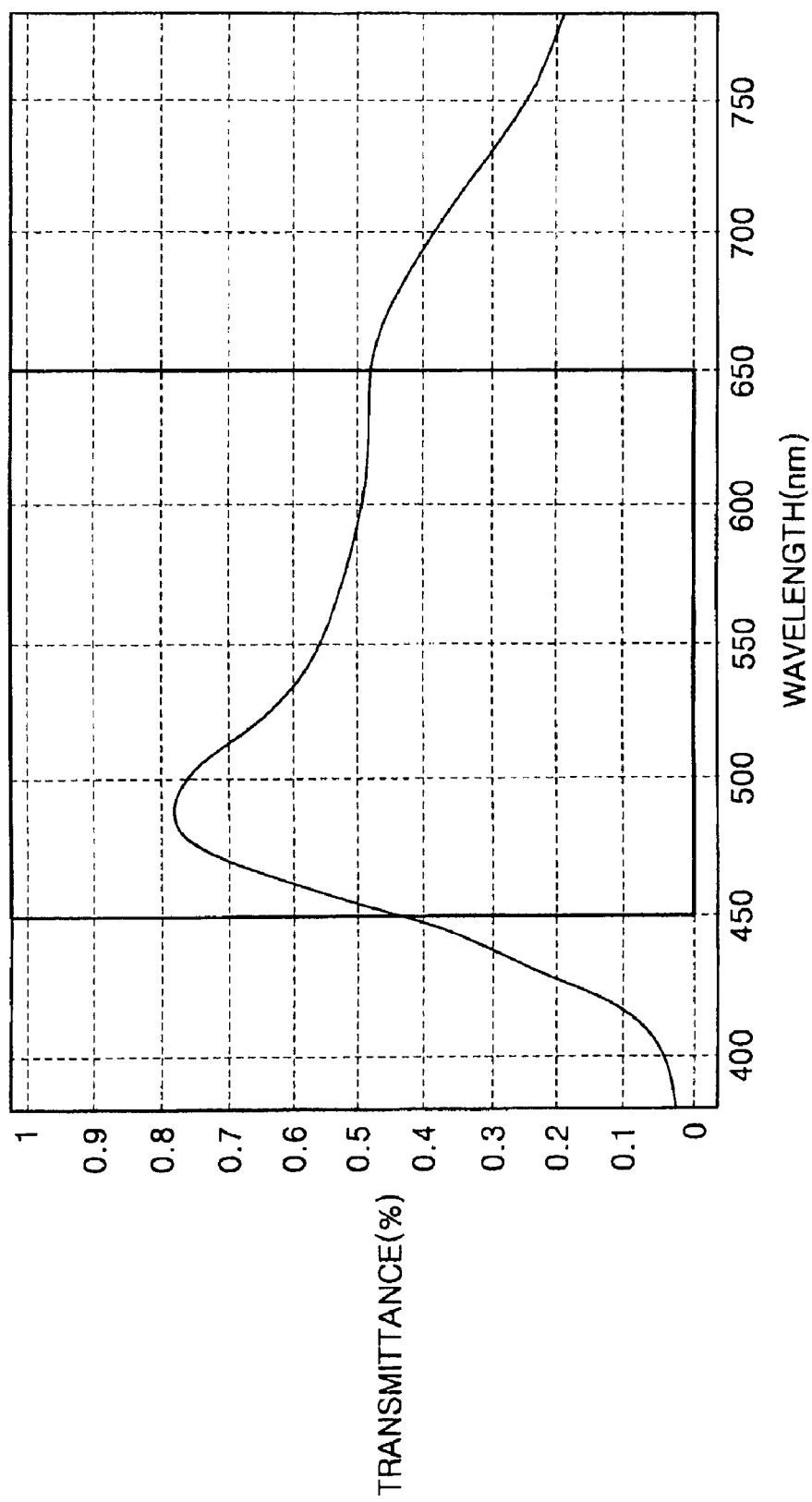
FIG. 5 is a graph showing a transmission spectrum according to a third exemplary embodiment of the present invention.

FIG. 5 is a graph showing a transmission spectrum according to the third exemplary embodiment of the present invention, in which a horizontal axis denotes a wavelength (nm) and a vertical axis denotes a transmittance (%).

Referring to FIG. 5, in the third exemplary embodiment, transmittance has a maximum value of 0.8% in a wavelength band from 450 to 550 nm, and rapidly decreases to 0.5% in a wavelength band from 600 to 650 nm. Thus, the transmittance according to the third exemplary embodiment decreases from 0.8% to 0.5% in the wavelength band of visible light. Here, the transmittance controlled layer according to the third exemplary embodiment has a refractive index of 1.75, and an optical path length of 1925 Å. Further, the metal layer has a reflectance of 24.3%.

Consequently, in the first, second, and third exemplary embodiments, 0.6% of the second exemplary embodiment is determined as a reference transmittance. However, because the transmittances of the first and third exemplary embodiments are also higher than 0.3%, and the transmittance controlled layer and the metal layer of the first and third exemplary embodiments can also be used to realize white light.

Figure 6:
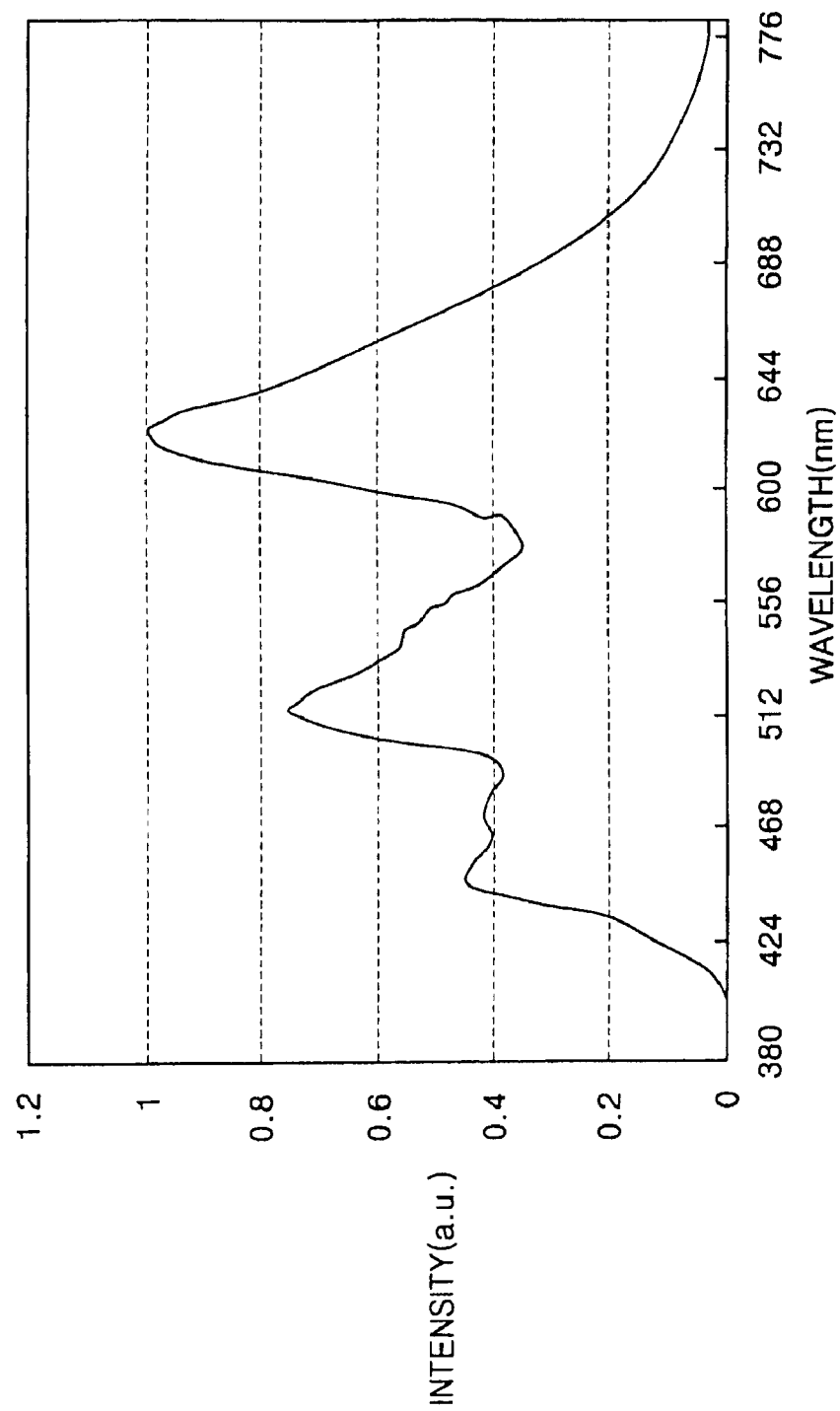
FIG. 6 is a graph showing an electroluminescence spectrum according to the first exemplary embodiment of the present invention.
Figure 7:
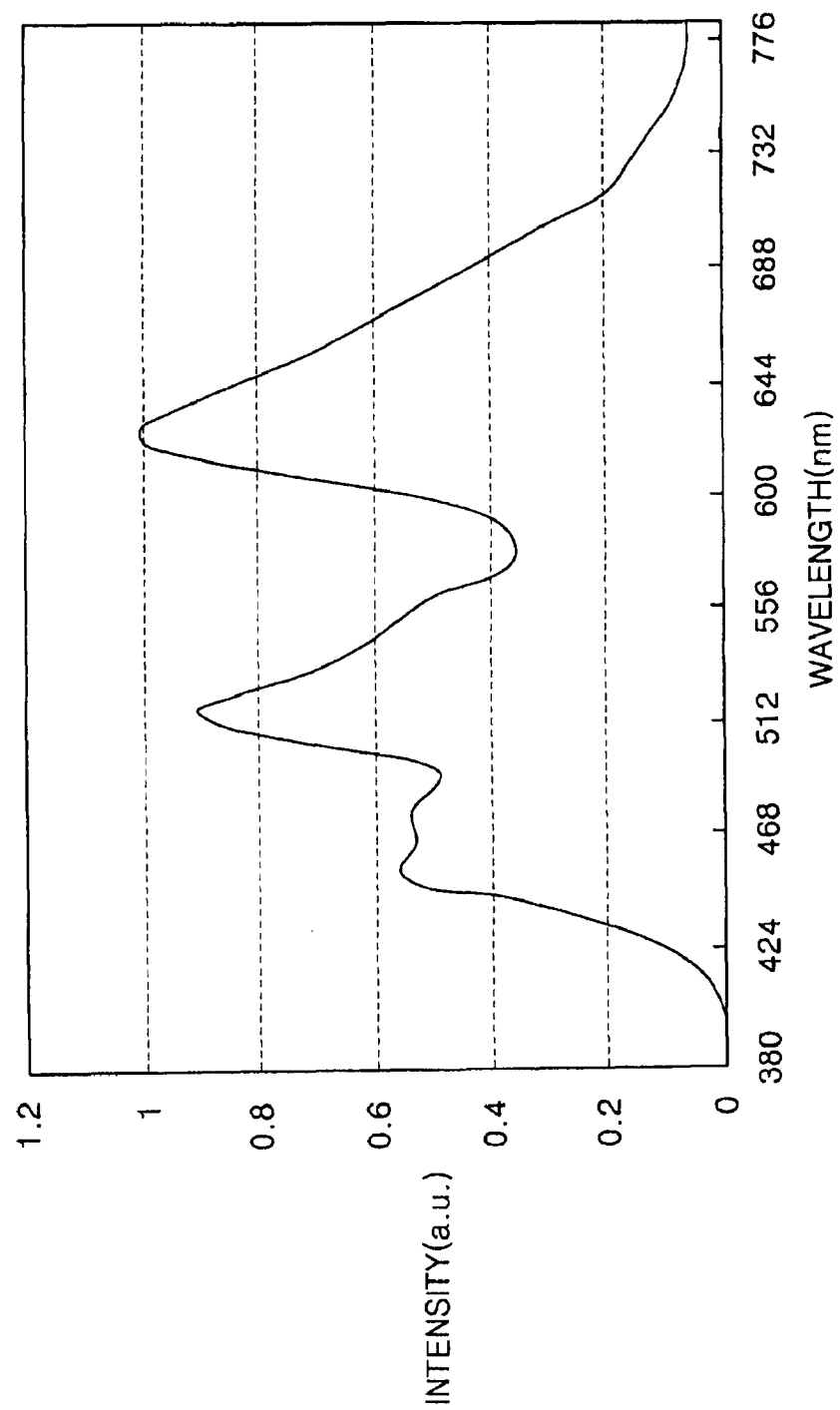
FIG. 7 is a graph showing an electroluminescence spectrum according to the second exemplary embodiment of the present invention.
Figure 8:
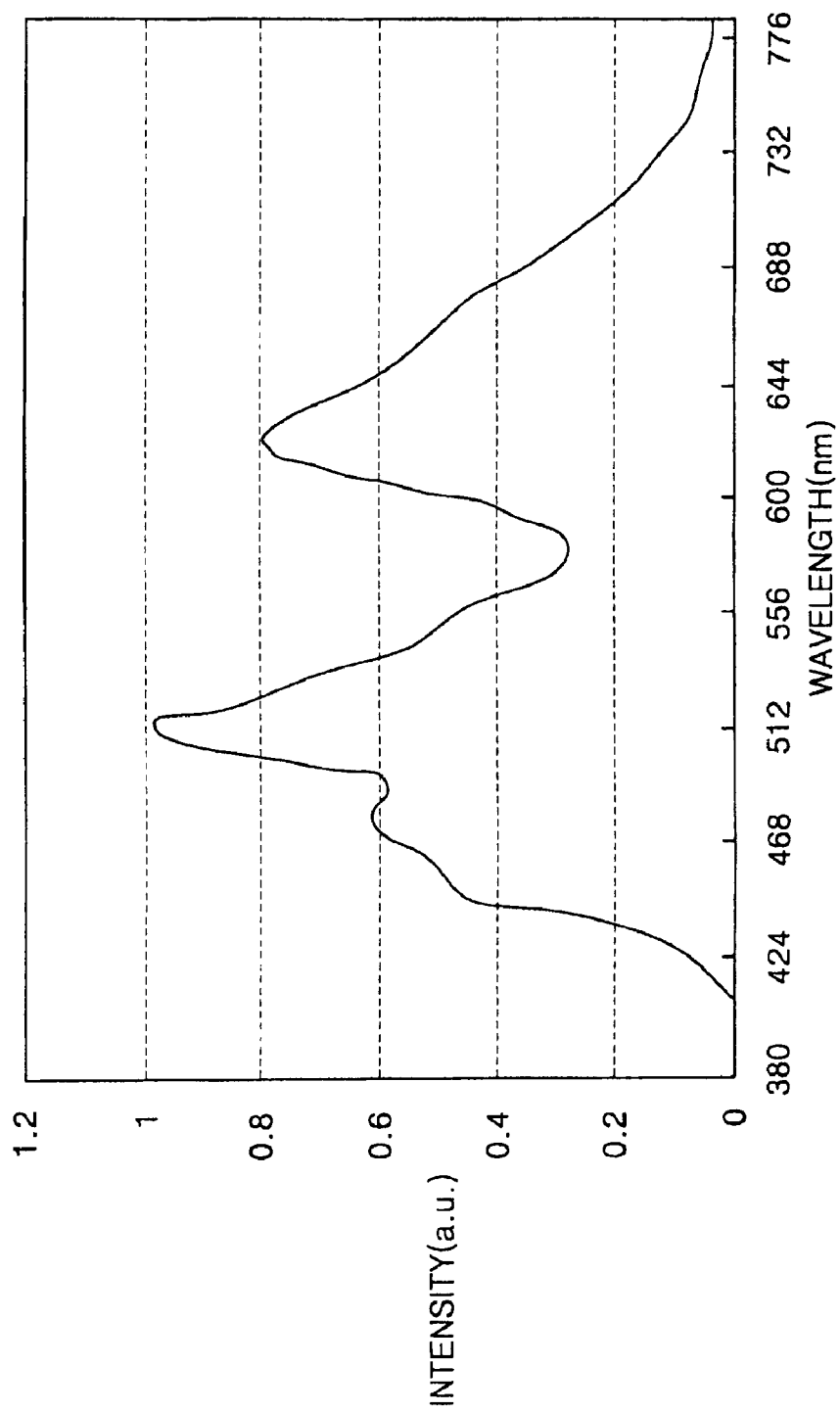
FIG. 8 is a graph showing an electroluminescence spectrum according to the third exemplary embodiment of the present invention.
Figure 9:
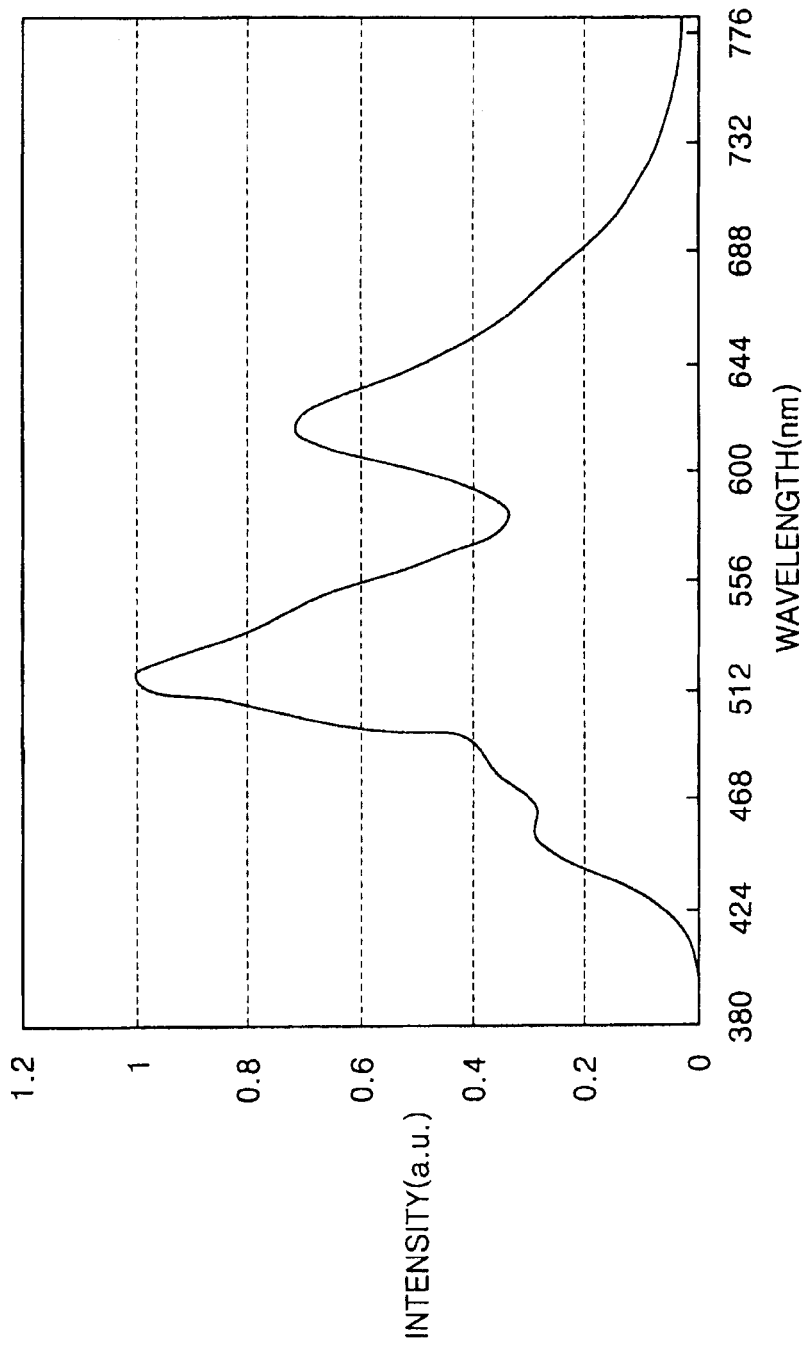
FIG. 9 is a graph showing an electroluminescence spectrum according to a comparative example.

FIG. 6 is a graph showing an electroluminescence spectrum according to the first exemplary embodiment of the present invention; FIG. 7 is a graph showing an electroluminescence spectrum according to the second exemplary embodiment of the present invention; FIG. 8 is a graph showing an electroluminescence spectrum according to the third exemplary embodiment of the present invention; and FIG. 9 is a graph showing an electroluminescence spectrum according to the comparative example, in which a horizontal axis denotes a wavelength (nm) and a vertical axis denotes an intensity (a.u.).

Referring to FIG. 6, a blue peak has a maximum value in a wavelength band ranging from 424 to 468 nm and an intensity of about 0.4. A green peak has a maximum value in a wavelength band ranging from 512 to 556 nm and an intensity of about 0.8. A red peak has a maximum value in a wavelength band ranging from 600 to 644 nm and an intensity of about 1. Here, the transmittance controlled layer according to the first exemplary embodiment has a refractive index of 1.75, and an optical path length of 1575 Å. Further, the metal layer has a reflectance of 24.3%.

Referring to FIG. 7, a blue peak has a maximum value in a wavelength band ranging from 424 to 468 nm and an intensity of about 0.6. A green peak has a maximum value in a wavelength band ranging from 512 to 556 nm and an intensity of about 0.9. A red peak has a maximum value in a wavelength band ranging from 600 to 644 nm and an intensity of about 0.1. Here, the transmittance controlled layer according to the second exemplary embodiment has a refractive index of 1.75, and an optical path length of 1750 Å. Further, the metal layer has a reflectance of 24.3%.

Referring to FIG. 8, a blue peak has some shoulder in a wavelength band ranging from 424 to 468 nm and an intensity of about 0.45. A green peak has a maximum value in a wavelength of 512 nm and an intensity of about 1. A red peak has a maximum value in a wavelength band ranging from 600 to 644 nm and an intensity of about 0.8. Here, the transmittance controlled layer according to the third exemplary embodiment has a refractive index of 1.75, and an optical path length of 1925 Å. Further, the metal layer has a reflectance of 24.3%.

Referring to FIG. 9, a blue peak has a maximum value in a wavelength band ranging from 424 to 468 nm and an intensity of about 0.3. A green peak has a maximum value in a wavelength ranging from 512 to 556 nm and an intensity of about 1. A red peak has a maximum value in a wavelength band ranging from 600 to 644 nm and an intensity of about 0.7. Here, the transmittance controlled layer according to the comparative example has a refractive index of 1.75, and an optical path length of 1075 Å.

Consequently, the blue, green, and red peaks of the first, second, and third exemplary embodiments are uniform as compared with the comparative example. Among the first, second and third exemplary embodiments, the blue, green and red peaks of the second exemplary embodiment are the most uniform.

Table 1 shows the color coordinates of the second exemplary embodiment and the comparative example.

TABLE 1

|  | x-color coordinates | y-color coordinates |
|---|---|---|
| Second exemplary embodiment | 0.3645 | 0.3726 |
| Comparative example | 0.3553 | 0.4491 |

Referring to Table 1, the y-color coordinate of the second exemplary embodiment is better than that of the comparative example for representing white light (e.g., closer to 0.31), but the x-color coordinate of the second exemplary embodiment is worse than that of the comparative example for representing white light (e.g., further from 0.31). However, a white characteristic becomes better when both the x- and y-color coordinates match (or approximate) with the coordinates of white light (e.g., both closer to 0.31, 0.31), so that the second exemplary embodiment is much better than the comparative example.

Figure 10:
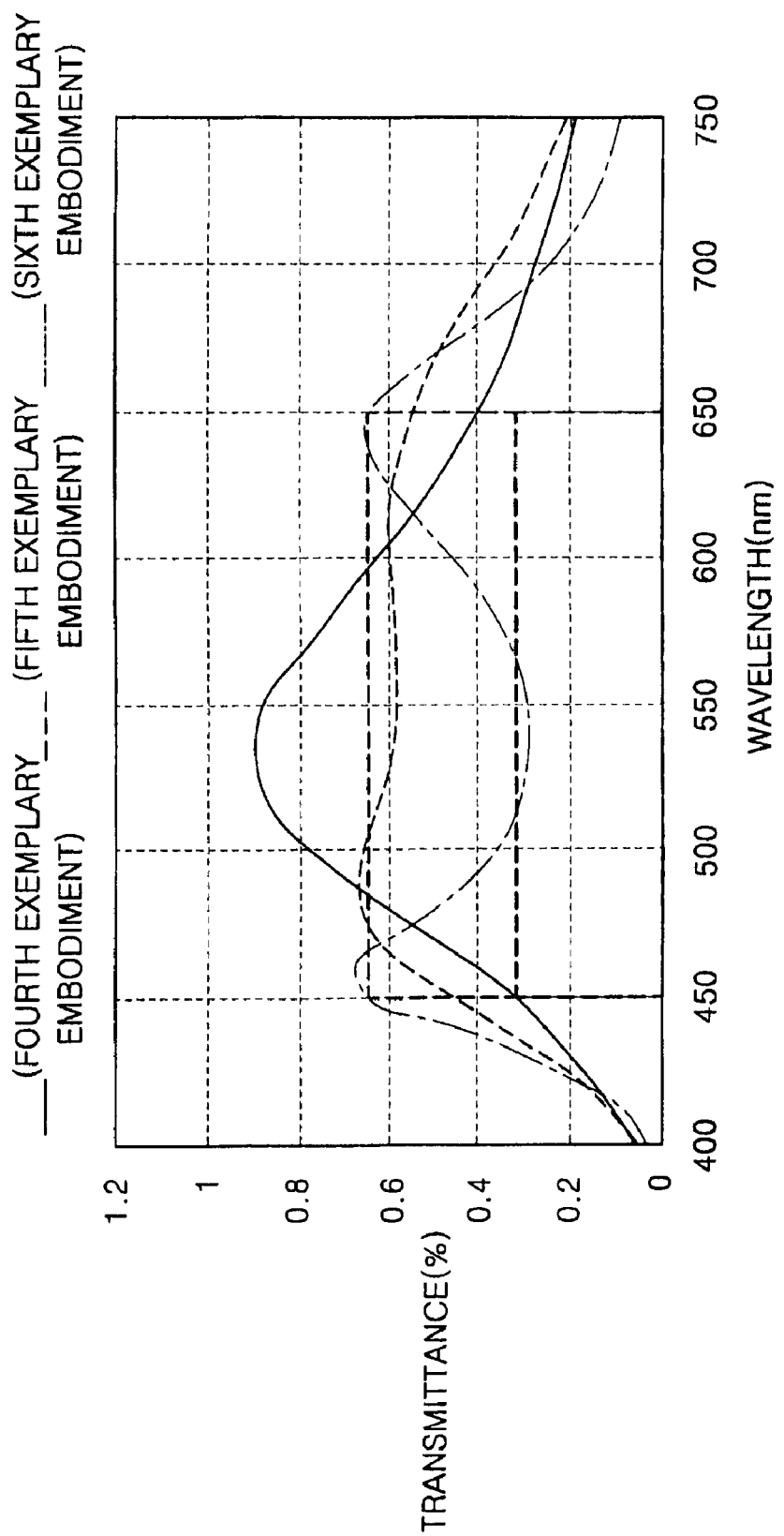
FIG. 10 is a graph showing transmission spectrums according to fourth, fifth and sixth exemplary embodiments of the present invention.

FIG. 10 is a graph showing transmission spectrums according to the fourth, fifth and sixth exemplary embodiments of the present invention, in which a horizontal axis denotes a wavelength (nm) and a vertical axis denotes a transmittance (%).

Referring to FIG. 10, in the fourth exemplary embodiment, transmittance is from 0.3 to 0.9% in a wavelength band ranging from 450 to 650 nm, and the maximum peak appears in a wavelength band ranging from 500 to 550 nm with a transmittance of 0.9%. In the fifth exemplary embodiment, transmittance is relatively flat around 0.6% in a wavelength band ranging from 450 to 650 nm. In the sixth exemplary embodiment, transmittance varies between 0.3 and 0.7 in a wavelength band ranging from 450 to 650 nm.

Thus, the transmission spectrum of the fifth exemplary embodiment becomes flat around a transmittance of 0.6%. This transmittance is called a reference transmittance. Further, the transmission spectrums of the fourth, fifth and sixth exemplary embodiments are all higher than a half of the reference transmittance, i.e., a transmittance of 0.3%. Here, the transmittance controlled layer according to the fourth, fifth and sixth exemplary embodiments has a refractive index of 1.75, and an optical path length of 1750 Å. Further, the metal layers of the fourth, fifth and sixth exemplary embodiments have reflectances of 4.3%, 24.3% and 48.3%, respectively.

Figure 11:
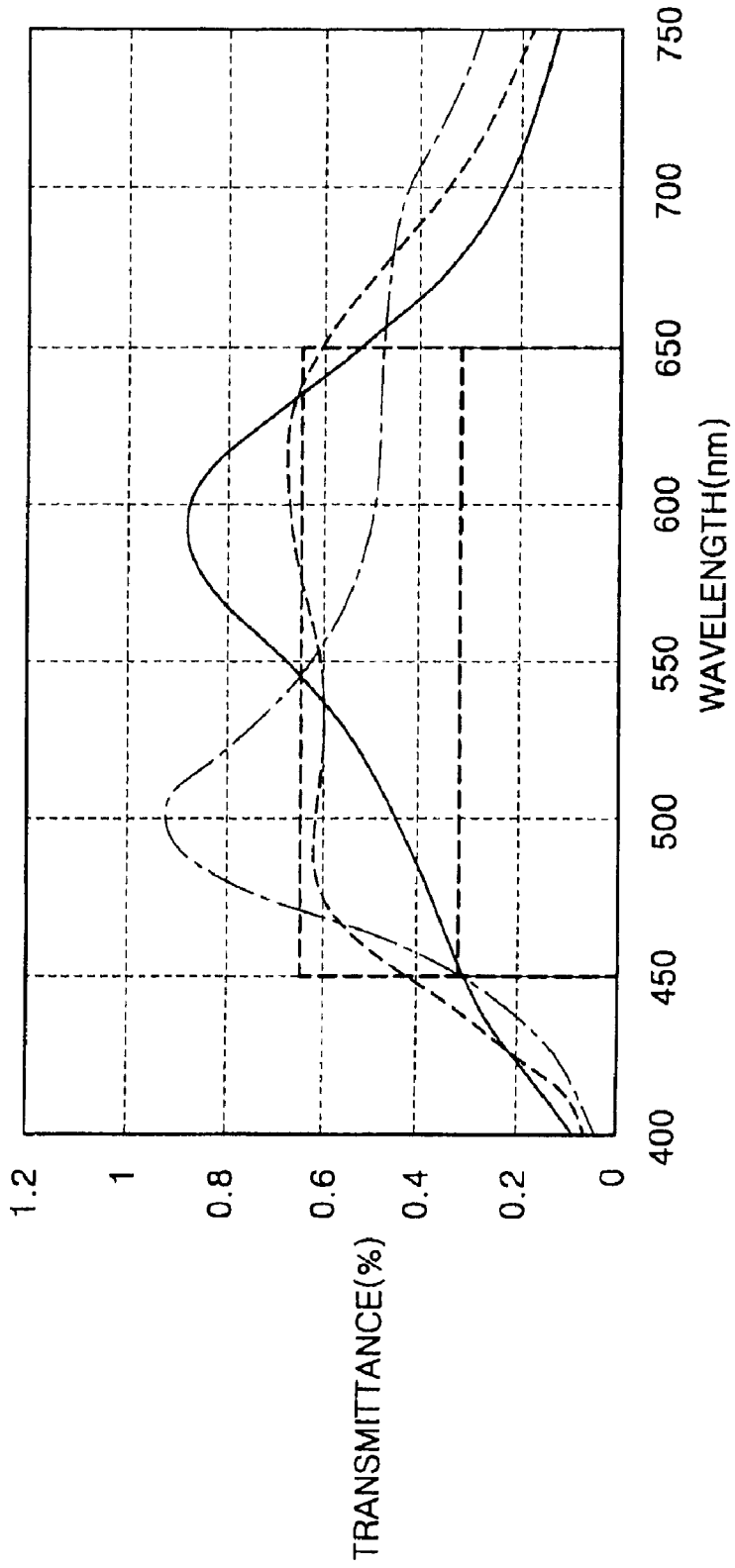
FIG. 11 is a graph showing transmission spectrums according to seventh, eighth and ninth exemplary embodiments of the present invention.

FIG. 11 is a graph showing transmission spectrums according to the seventh, eighth and ninth exemplary embodiments of the present invention, in which a horizontal axis denotes a wavelength (nm) and a vertical axis denotes a transmittance (%).

Referring to FIG. 11, in the seventh exemplary embodiment, transmittance varies somewhat between 0.3% and 0.9% in a wavelength band ranging from 450 to 650 nm, and the maximum peak appears in a wavelength band ranging 550 from 600 nm with a transmittance of 0.9%. In the eighth exemplary embodiment, transmittance is relatively constant at about 0.6% in a wavelength band ranging from 450 to 650 nm. In the ninth exemplary embodiment, transmittance varies between 0.3% and 0.9% in a wavelength band ranging from 450 to 650 nm, and the maximum peak appears in a wavelength of 550 nm with a transmittance of 0.9%.

In the seventh, eighth and ninth exemplary embodiments, magnesium fluoride ($MgF_2$) used as the transmittance controlled layer has a refractive index of 1.38, and thus the optical path lengths of the seventh, eighth and ninth exemplary embodiments are 1450 Å, 1800 Å and 2140 Å, respectively. Further, the metal layers of the seventh, eighth and ninth exemplary embodiments each have a reflectance of 24.3%.

Also, the transmission spectrum of the eighth exemplary embodiment becomes flat at a transmittance of about 0.6%. This transmittance is called a reference transmittance. Further, the transmission spectrums of the seventh and ninth exemplary embodiments are all higher than a half of the reference transmittance, i.e., a transmittance of 0.3%, so that they are suitable for the transmittance controlled layer and the metal layer according to embodiments of the present invention (e.g., they can be used to realize white light).

Figure 12:
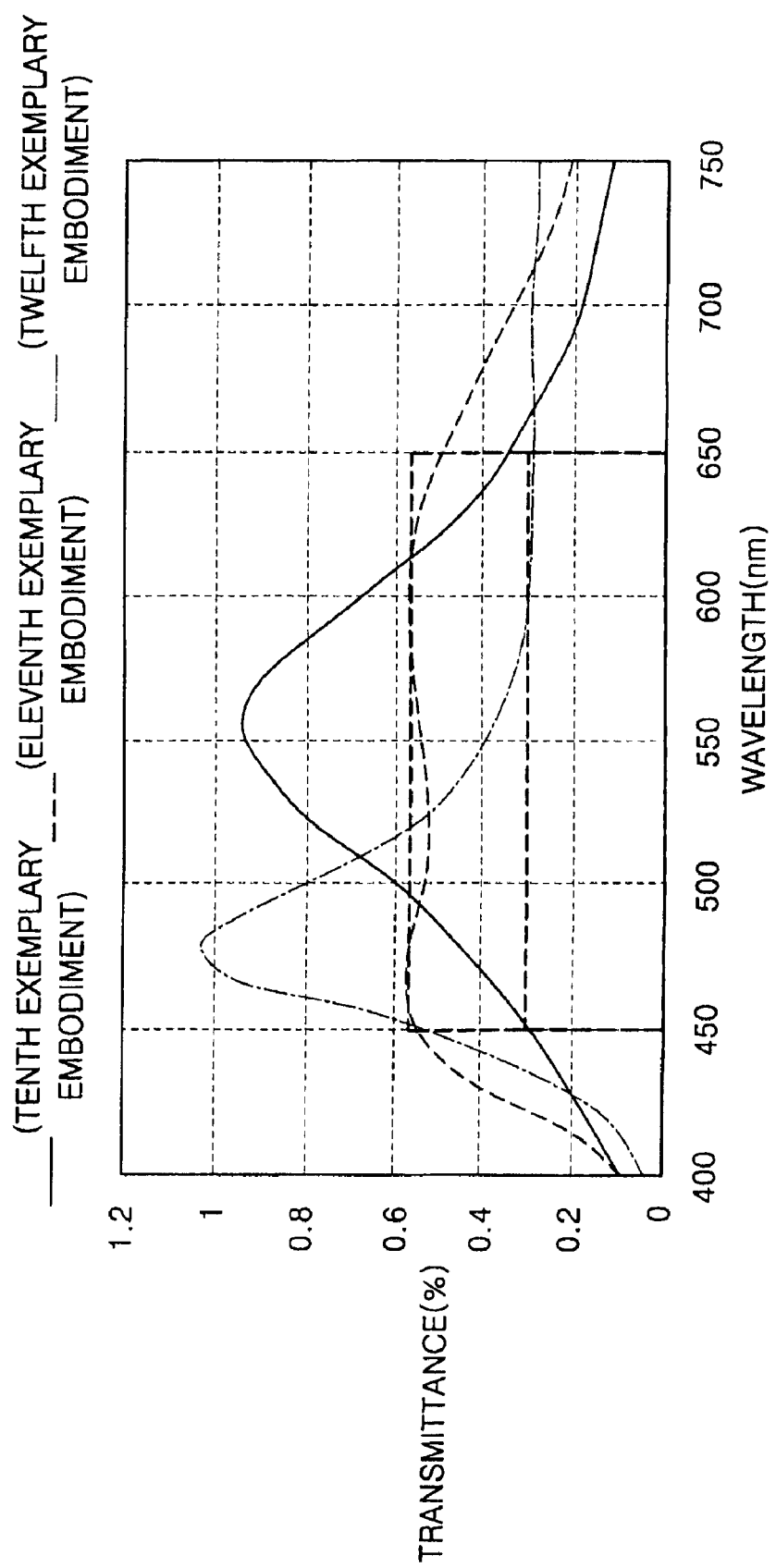
FIG. 12 is a graph showing transmission spectrums according to tenth, eleventh and twelfth exemplary embodiments of the present invention.

FIG. 12 is a graph showing transmission spectrums according to the tenth, eleventh, and twelfth exemplary embodiments of the present invention, in which a horizontal axis denotes a wavelength (nm) and a vertical axis denotes a transmittance (%).

Referring to FIG. 12, in the tenth exemplary embodiment, transmittance varies somewhat between 0.3% and 0.9% in a wavelength band ranging from 450 to 650 nm, and the maximum peak appears in a wavelength band ranging from 550 to 600 nm with a transmittance of 0.9%. In the eleventh exemplary embodiment, transmittance is relatively constant at about 0.6% in a wavelength band ranging from 450 to 650 nm. In the twelfth exemplary embodiment, transmittance varies between 0.3% and 0.9% in a wavelength band ranging from 450 to 650 nm, and the maximum peak appears in a wavelength band ranging from 450 to 500 nm with a transmittance of about 1%.

In the tenth, eleventh and twelfth exemplary embodiments, selenium zinc (ZnSe) used as the transmittance controlled layer has a refractive index of 2.6, and thus the optical path lengths of the seventh, eighth and ninth exemplary embodiments are 520 Å, 1040 Å and 1610 Å, respectively. Further, the metal layers of the tenth, eleventh and twelfth exemplary embodiments each have a reflectance of 24.3%.

Also, the transmission spectrum of the eleventh exemplary embodiment becomes flat at a transmittance of about 0.6%. This transmittance is called a reference transmittance. Further, the transmission spectrums of the tenth and twelfth exemplary embodiments are all higher than a half of the reference transmittance, i.e., a transmittance of 0.3%, so that they are suitable for the transmittance controlled layer and the metal layer according to embodiments of the present invention.

As described above and according to certain embodiments of the present invention, a transmittance controlled layer and a metal layer are disposed on a second electrode in sequence, so that an organic light emitting display device can realize white light because the transmittance is substantially (or approximately) the same within a wavelength band of visible light. Further, the resonance effect is suppressed, and the brightness is enhanced.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising: a substrate; a first electrode disposed on the substrate and including a reflection layer; an organic layer disposed on the first electrode and including a white emission layer; a transflective second electrode disposed on the organic layer; a transmittance controlled layer disposed on the transflective second electrode; and a metal layer disposed on the transmittance controlled layer, wherein the transmittance controlled layer and the metal layer are configured to cause an interference effect to control a transmittance and a reflectance of the transflective second electrode.

2. The organic light emitting display device according to claim 1, wherein the reflection layer comprises a material selected from the group consisting of aluminum, silver, and alloys thereof.

3. The organic light emitting display device according to claim 1, wherein the white emission layer is a single layer structure.

4. The organic light emitting display device according to claim 1, wherein the white emission layer is a multiple layer structure.

5. The organic light emitting display device according to claim 4, wherein the multiple layers comprise an orange-red emission layer and a blue emission layer.

6. The organic light emitting display device according to claim 4, wherein the multiple layers comprise a blue emission layer, a green emission layer, and a red emission layer.

7. The organic light emitting display device according to claim 1, wherein the transmittance controlled layer has an optical path length ranging from about 520 to about 2140 Å.

8. The organic light emitting display device according to claim 1, wherein the transmittance controlled layer comprises a material selected from the group consisting of $Al_2O_3$, $SiN_x$, $SiO_2$, SiON, $MgF_2$, ZnS, ZnSe, $TeO_2$, $ZrO_2$, aylenediamine derivatives, triamine derivatives, CBP, aluminum-quinoline complex (Alq3), and combinations thereof.

9. The organic light emitting display device according to claim 1, wherein the metal layer has a reflectance ranging from about 4.3 to about 48.3%.

10. The organic light emitting display device according to claim 1, wherein the metal layer comprises a material selected from the group consisting of magnesium (Mg), silver (Ag), calcium (Ca), magnesium silver (MgAg), magnesium calcium (MgCa), aluminum silver (AlAg), ytterbium silver (YbAg), and combinations thereof.

11. The organic light emitting display device according to claim 1, further comprising a passivation layer on the metal layer.

12. The organic light emitting display device according to claim 1, further comprising a color filter layer on the metal layer.

13. The organic light emitting display device according to claim 1, wherein the transmittance controlled layer and the metal layer are configured to cause an interference effect to control a transmittance and a reflectance of the transflective second electrode to adjust an intensity of a transmission spectrum according to wavelength bands.

14. A method of fabricating an organic light emitting display device, the method comprising: providing a substrate; forming a first electrode including a reflection layer on the substrate; forming an organic layer including a white emission layer on the first electrode; forming a transflective second electrode on the organic layer; forming a transmittance controlled layer on the transflective second electrode; and forming a metal layer on the transmittance controlled layer, wherein the transmittance controlled layer and the metal layer are configured to cause an interference effect to control a transmittance and a reflectance of the transflective second electrode.

15. The method according to claim 14, wherein the organic layer is formed by vacuum deposition, inkjet printing, and/or laser induced thermal imaging.

16. The method according to claim 14, wherein the transmittance controlled layer is formed by vacuum deposition and/or lithography.

17. The method according to claim 14, wherein the metal layer is formed by vacuum deposition and/or sputtering.

18. An organic light emitting display device comprising: a substrate; a reflective electrode disposed on the substrate; an organic layer disposed on the reflective electrode; a transflective electrode disposed on the organic layer; a transmittance controlled layer disposed on the transflective electrode; and a metal layer disposed on the transmittance controlled layer, wherein the transmittance controlled layer and the metal layer are configured to cause an interference effect to control a transmittance and a reflectance of the transflective electrode.

19. The organic light emitting display device according to claim 1, wherein the transmittance controlled layer has an optical path length between about 520 and about 2140 Å; and the metal layer has a reflectance between about 4.3 and about 48.3%.

* * * * *